(12) United States Patent
Anderson et al.

(10) Patent No.: US 7,851,694 B2
(45) Date of Patent: *Dec. 14, 2010

(54) EMBOSSED HIGH MODULUS ENCAPSULANT SHEETS FOR SOLAR CELLS

(75) Inventors: Jerrel C. Anderson, Vienna, WV (US); Richard Allen Hayes, Beaumont, TX (US); Geraldine M. Lenges, Wilmington, DE (US); Charles Anthony Smith, Vienna, WV (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 785 days.

This patent is subject to a terminal disclaimer.

(21) Appl. No.: 11/491,341

(22) Filed: Jul. 21, 2006

(65) Prior Publication Data

US 2008/0017241 A1   Jan. 24, 2008

(51) Int. Cl.
 *H01L 31/00* (2006.01)
(52) U.S. Cl. .................................. 136/251; 136/259
(58) Field of Classification Search ............... 136/251, 136/259
See application file for complete search history.

(56) References Cited

U.S. PATENT DOCUMENTS

| | | |
|---|---|---|
| 3,344,014 A | 9/1967 | Rees |
| 3,957,537 A | 5/1976 | Baskett et al. |
| 4,083,097 A | 4/1978 | Anagnostou et al. |
| 4,452,935 A | 6/1984 | Nomura et al. |
| 5,091,258 A | 2/1992 | Moran |
| 5,228,926 A | 7/1993 | Glatfelter et al. |
| 5,455,103 A * | 10/1995 | Hoagland et al. ........... 428/167 |
| 5,476,553 A | 12/1995 | Hanoka et al. |
| 5,478,402 A | 12/1995 | Hanoka |
| 5,508,205 A | 4/1996 | Dominguez et al. |
| 5,626,809 A | 5/1997 | Mortelmans |
| 5,733,382 A | 3/1998 | Hanoka |
| 5,741,370 A | 4/1998 | Hanoka |
| 5,762,720 A | 6/1998 | Hanoka et al. |
| 5,763,062 A | 6/1998 | Smith et al. |
| 5,986,203 A | 11/1999 | Hanoka et al. |
| 6,093,471 A | 7/2000 | Hopfe et al. |
| 6,114,046 A * | 9/2000 | Hanoka ....................... 428/515 |
| 6,187,448 B1 | 2/2001 | Hanoka et al. |

(Continued)

FOREIGN PATENT DOCUMENTS

EP    0 483 087 A1    4/1992

(Continued)

OTHER PUBLICATIONS

Copending U.S. Appl. No. 11/588,628.*

(Continued)

*Primary Examiner*—Jeffrey T Barton (57) ABSTRACT

A thermoplastic film or sheet having a thickness of about 1 mil (0.026 mm) to about 20 mils (0.51 mm) containing a surface embossed layer comprising a copolymer of alpha olefin(s) with alpha, beta ethylenically unsaturated carboxylic acid comonomer(s), ionomers derived therefrom and combinations thereof useful for making solar cell laminates, wherein the surface is embossed with a pattern which provides channels for de-airing, the channels having depth of about 20 microns or less, a width of about 30 microns to about 300 microns and spaced about 0.1 mm to about 1 mm apart, and use thereof in photovoltaic cells and the manufacture thereof.

28 Claims, 3 Drawing Sheets

U.S. PATENT DOCUMENTS

| | | | |
|---|---|---|---|
| 6,319,596 | B1 | 11/2001 | Kernander et al. |
| 6,320,116 | B1 | 11/2001 | Hanoka |
| 6,335,479 | B1 * | 1/2002 | Yamada et al. ............. 136/251 |
| 6,353,042 | B1 | 3/2002 | Hanoka et al. |
| 6,414,236 | B1 | 7/2002 | Kataoka et al. |
| 6,586,271 | B2 | 7/2003 | Hanoka |
| 6,660,556 | B2 | 12/2003 | Hashimoto et al. |
| 6,660,930 | B1 | 12/2003 | Gonsiorawski |
| 6,693,237 | B2 | 2/2004 | Zenko et al. |
| 6,777,610 | B2 | 8/2004 | Yamada et al. |
| 6,800,355 | B2 | 10/2004 | Wong |
| 6,863,956 | B1 | 3/2005 | Nakajima et al. |
| 6,940,008 | B2 | 9/2005 | Shiotsuka et al. |
| 7,303,788 | B2 | 12/2007 | Kataoka et al. |
| 2002/0155302 | A1 | 10/2002 | Smith et al. |
| 2002/0179139 | A1 | 12/2002 | Hashimoto et al. |
| 2003/0000568 | A1 | 1/2003 | Gonsiorawski |
| 2003/0022015 | A1 * | 1/2003 | Wong ......................... 428/631 |
| 2003/0044579 | A1 | 3/2003 | Bolton et al. |
| 2003/0098060 | A1 | 5/2003 | Yoshimi |
| 2003/0124296 | A1 * | 7/2003 | Smith ........................... 428/49 |
| 2004/0053008 | A1 * | 3/2004 | Kim ........................... 428/167 |
| 2004/0144415 | A1 | 7/2004 | Arhart |
| 2005/0279401 | A1 | 12/2005 | Arhart |
| 2006/0057392 | A1 | 3/2006 | Smillie |
| 2006/0084763 | A1 | 4/2006 | Arhart |
| 2006/0141212 | A1 * | 6/2006 | Smith et al. ................. 428/141 |
| 2006/0165929 | A1 | 7/2006 | Lenges |
| 2009/0023867 | A1 | 1/2009 | Nishijima et al. |
| 2009/0120489 | A1 | 5/2009 | Nishijima et al. |

FOREIGN PATENT DOCUMENTS

| | | | |
|---|---|---|---|
| JP | 06-322334 A | 11/1994 |
| JP | 08-316508 A | 11/1996 |
| JP | 11-026791 A | 1/1999 |
| JP | 2000-186114 A | 7/2000 |
| JP | 2001-089616 A | 4/2001 |
| JP | 2001-119047 A | 4/2001 |
| JP | 2001-119056 A | 4/2001 |
| JP | 2001-119057 A | 4/2001 |
| JP | 2001144313 A | 5/2001 |
| JP | 2004-031445 A | 1/2004 |
| JP | 2005-034913 | 2/2005 |
| JP | 2005-064266 | 3/2005 |
| JP | 2005-064268 | 3/2005 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006-186233 A | 7/2006 |
| JP | 2006-186237 A | 7/2006 |
| JP | 2006-190865 A | 7/2006 |
| JP | 2006-190867 A | 7/2006 |
| WO | 2006/085603 A1 | 8/2006 |
| WO | 2006/095762 A1 | 9/2006 |
| WO | 2007064922 A1 | 6/2007 |

OTHER PUBLICATIONS

Copending U.S. Appl. No. 12/012,891.*
Copending U.S. Appl. No. 11/495,391.*
Copending U.S. Appl. No. 11/495,249.*
PCT International Search Report for International application No. PCT/US2007/016191, dated Mar. 11, 2008.
U.S. Appl. No. 11/386,143, filed Mar. 21, 2006.
PCT International Preliminary Report on Patentability for International application No. PCT/US2007/016191, dated Feb. 5, 2009.

* cited by examiner

EMBOSSED HIGH MODULUS ENCAPSULANT SHEETS FOR SOLAR CELLS

FIELD OF THE INVENTION

The present invention relates to thermoplastic film or sheets containing a layer comprising copolymers of alpha olefin(s) with alpha, beta ethylenically unsaturated carboxylic acid comonomer(s), or ionomers derived therefrom (as well as combinations thereof) and their use in solar cells.

BACKGROUND OF THE INVENTION

Photovoltaic (solar) cell modules are units that convert light energy into electrical energy. Typical or conventional construction of a solar cell module consists of at least five structural layers. The layers of a conventional solar cell module are constructed in the following order starting from the top, or incident layer (that is, the layer first contacted by light) and continuing to the backing (the layer furthest removed from the incident layer): (1) incident layer/(2) frontsheet encapsulant layer/(3) voltage-generating layer/(4) backsheet (second) encapsulant layer/(5) backing layer. The function of the incident layer is to provide a transparent protective window that will allow sunlight into the solar cell module. The incident layer is typically a glass plate or a thin polymeric film (such as a fluoropolymer or polyester film), but could conceivably be any material which is transparent to sunlight.

In the fabrication of laminated solar cell modules, it is customary to place a piece of encapsulant sheeting between the other module layers, such as the outer module surfaces, for example a rigid sheet of glass or steel or flexible films, such as fluoropolymer or polyester films and embedded layers, such as the solar cell and other layers within the module design. The encapsulant layers are designed to encapsulate and protect the fragile voltage-generating layer. Generally, a solar cell module will incorporate at least two encapsulant layers sandwiched around the voltage-generating layer. The two encapsulant layers can be the same material or different and distinct. The optical properties of the frontsheet encapsulant layer must be such that light can be effectively transmitted to the voltage-generating layer.

Solar cell modules are laminated through a wide variety of processes, including, for example, autoclave, nip roll, and vacuum lamination processes. Air can become trapped within the module during lamination. It has been disclosed to use a layer of glass non-woven scrim placed on the encapsulant surfaces (See, e.g., U.S. Pat. No. 6,075,202 and U.S. Pat. No. 6,093,581), roughen the surface or place a pattern on the surface in order to facilitate the removal of air. The degree to which air must be removed (reduced) from between the solar cell module layers will depend on the nature of the encapsulant layer to absorb the air (dissolution) during the further laminating steps such that the air forms a 'solution' with the encapsulant layer. The presence of a gaseous phase within the laminate will take the form of bubbles or pockets of gas between the encapsulant layer and the other layers interface. These are generally objectionable for front sheet solar cell applications where the laminate functions as a transparent article, that is, being essentially free of optical defects (e.g. relatively low-haze thus providing a transparent front sheet to provide the maximum light transmission and, in turn, maximum solar cell efficiency). Trapped air can be removed during the lamination process, such as by vacuum de-airing or by nipping the assembly between a pair of rollers.

In the case of vacuum de-airing, air is removed while the assembly is at ambient or elevated temperature. Tacking of the encapsulant layer to the other solar cell assembly layers and sealing of the edges is accomplished by heating the entire assembly while it is still under vacuum. Further heating provides the laminated solar cell module. The heated solar cell module may optionally be pressed together during the lamination process.

In the case of nipping, the assembly is generally heated to a temperature between 50-200° C., and is then passed through one or more sets of nip rolls. Edge sealing is accomplished by the force of the rollers exerted on the solar cell laminate.

Solar cell laminates can be obtained using various types of encapsulant layer materials, including, for example: polyvinyl butyral (PVB); thermoplastic polyurethane (TPU); ethylene copolymers such as ethylene vinyl acetate (EVA); silicone polymers; and polyvinyl chloride (PVC), with PVB and EVA being more common and EVA being the most common. It is sometimes difficult to choose an encapsulant layer with optimal features for pre-pressing, namely, rapid air removal and proper edge seal. Encapsulant layers which have rougher surfaces as measured by the 10-point roughness (ISO R468), Rz, can allow for faster de-airing. However, such encapsulant layers can make it inconvenient to obtain edge seal as more energy is generally required to compact the rough encapsulant layer. If the edges of the pre-press are not completely sealed, air can penetrate the edge in the autoclaving step where the pre-press is heated under high pressure, and can cause visual defects in the laminate which is commercially unacceptable. Laminators who use vacuum for de-airing in hot environments can have added difficulty. Encapsulant layers that are rough and allow for rapid de-airing at about room temperature (23° C.) often do not de-air as well when the ambient temperature is much above 30° C.

On the other hand, relatively smooth encapsulant layers can lead to the edges sealing before sufficient air is removed, and can leave air trapped inside the pre-press. This problem is commonly referred to as pre-mature edge seal, and can be especially common with PVB and EVA encapsulant layers. During autoclaving, the excess air may be forced into solution under high pressure, but may return to the gas phase after autoclaving. Defects which occur after lamination are often more costly to rectify.

Encapsulant layers are typically heated during the lamination process to soften the encapsulant layer and facilitate adhesion to, for example; glass, steel, silicon or plastic materials. Surface patterns on the encapsulant layers can be provided to allow for rapid de-airing even at high temperatures, and also allow good edge seal to be obtained. Choice or design of an ideal surface pattern can depend on the lamination process parameters as well as on the encapsulant layer material. For example, PVB that is plasticized for use as an encapsulant material is a tacky material that readily adheres to glass even at room temperature. Various surface patterns can be used with PVB, but typically the patterns are designed to account for the physical characteristics of the specific interlayer and/or the specific process. For specific PVB interlayer surface patterns designed for safety glass glazing applications, see, for example; U.S. Pat. No. 4,452,935, U.S. Pat. No. 5,091,258, U.S. Pat. No. 5,455,103, U.S. Pat. No. 5,626,809, U.S. Pat. No. 6,093,471, U.S. Pat. No. 6,800,355 and U.S. Pat. No. 6,863,956. For specific EVA encapsulant layer surface patterns designed for solar batteries, see U.S. Pat. No. 6,660,556. As a further example, see US 2003/0098060 which discloses certain optimized embossed surface patterns for soft solar cell encapsulant layers, such as EVA.

A more recent development has been the use of higher modulus ethylene copolymers which incorporate acid functionality and ionomers derived therefrom which have excellent creep resistance, blocking resistance and advantageous self-adhesion to the other components contained within the solar cell construction. Solar cell modules which include smooth surfaced encapsulant films and sheets with at least one layer of the higher modulus ethylene copolymers which incorporate acid functionality and/or ionomers derived therefrom are disclosed within, for example, U.S. Pat. No. 3,957,537, U.S. Pat. No. 5,476,553, U.S. Pat. No. 5,478,402, U.S. Pat. No. 5,508,205, U.S. Pat. No. 5,733,382, U.S. Pat. No. 5,741,370, U.S. Pat. No. 5,762,720, U.S. Pat. No. 5,986,203, U.S. Pat. No. 6,114,046, U.S. Pat. No. 6,187,448, U.S. Pat. No. 6,319,596, U.S. Pat. No. 6,320,116, U.S. Pat. No. 6,353,042, U.S. Pat. No. 6,414,236, U.S. Pat. No. 6,586,271, U.S. Pat. No. 6,660,930, U.S. Pat. No. 6,693,237, U.S. Pat. No. 6,777,610, U.S. Pat. No. 6,940,008, US 2003/0000568, US 2004/0191422 and US 2005/0279401. Several of these disclosures teach against the use of glass nonwoven scrim layers to facilitate de-airing of the solar cell assemblies during the lamination process. See, for example; U.S. Pat. No. 5,741,370, U.S. Pat. No. 5,762,720 and U.S. Pat. No. 5,986,203.

The higher modulus ethylene copolymers which incorporate acid functionality and ionomers derived therefrom are typically not plasticized, and the physical properties of encapsulant layer sheeting obtained therefrom can be substantially different from the physical properties of other encapsulant layer materials such as EVA and PVB. Due to these physical differences, surface patterns useful for EVA and plasticized PVB encapsulant layer sheeting may not be ideal for the ethylene copolymers which incorporate acid functionality and ionomers derived therefrom encapsulant layer sheeting, and vice versa. (Scored ionomeric safety glass interlayers have been disclosed within, for example, US 2002/0155302, US 2003/0044579 and EP 0 483 087.)

The surface patterns for EVA and plasticized PVB, for example, tend to be deep to allow air to escape during the lamination process. The broad melting or softening range of EVA and plasticized PVB allows the use of such deep patterns. However, the use of deep patterns with the higher modulus ethylene copolymers which incorporate acid functionality and ionomers derived therefrom interlayers can be problematic. Ionomer, in particular, can attract dirt and the deep patterns tend to allow more dust or dirt to settle on the surface of the encapsulant layer and can give rise to "pattern haze" in the laminate. Also, the sharper melting range of an unplasticized, non-cured (non-crosslinked) encapsulant layer can lead to trapped air in the laminate.

SUMMARY OF THE INVENTION

This invention is directed to a thermoplastic film or sheet having a thickness of about 1 mil (0.026 mm) to about 25 mils (0.64 mm) containing a surface embossed layer comprising a copolymer of alpha olefin(s) with alpha, beta ethylenically unsaturated carboxylic acid comonomer(s), ionomers derived therefrom and combinations thereof useful for making solar cell laminates, wherein the surface is embossed with a pattern which provides channels for de-airing. More preferably the thickness of the film and sheet will range from about 1 mil, (0.026 mm), and about 20 mils, (0.51 mm).

Preferably the channels having depth of about 20 microns or less, a width of about 30 microns to about 300 microns and spaced about 0.1 mm to about 1 mm apart. More preferably the channels have a depth of about 12 microns to about 20 microns.

Preferably the copolymer is an ethylene (meth)acrylic acid copolymer containing about 10 to about 22 weight percent repeat units from (meth)acrylic acid, based on the total weight of the copolymer.

In one preferred embodiment, the film or sheet is a monolayer sheet.

In another preferred embodiment, the film or sheet is a multilayer film or sheet. In one more preferred embodiment, the multilayer film or sheet is embossed through one or more layers.

In a preferred embodiment, the multilayer film or sheet contains two layers, one layer being the surface embossed layer and the second layer comprising a polymer selected from the group consisting of ethylene vinyl acetate, ionomer, or ethylene acrylate ester copolymers.

In another preferred embodiment, the multilayer film or sheet contains two layers, one layer being the surface embossed layer and the second layer comprising an ethylene acrylate copolymer, preferably a polymer selected from the group consisting of ethylene co-butyl-acrylate or ethylene co-methyl-acrylate.

In one preferred embodiment, the multilayer film or sheet contains three layers, and the inner layer comprises a polymer selected from the group consisting of ethylene vinyl acetate, ionomer, or ethylene acrylate ester copolymers. In another preferred embodiment, the multilayer film or sheet contains three layers, and the inner layer comprises a polymer selected from the group consisting of ethylene co-butyl-acrylate or ethylene co-methyl-acrylate.

In another preferred embodiment, the multilayer film or sheet contains at least three layers, wherein one outside surface comprises the surface embossed layer and the other outside surface comprises a second surface embossed layer comprising a copolymer of alpha olefin(s) with alpha, beta ethylenically unsaturated carboxylic acid comonomer(s), ionomers derived therefrom and combinations thereof useful for making solar cell laminates, wherein the surface is embossed with a pattern which provides channels for de-airing, the channels having depth of about 20 microns or less, a width of about 30 microns to about 300 microns and spaced about 0.1 mm to about 1 mm apart.

In one preferred embodiment, the film or sheet is embossed with the pattern on only one side. In another preferred embodiment, the film or sheet is embossed with the pattern on both sides.

Preferably the pattern is a regular pattern (i.e., a pattern which repeats) which provides relatively uninterrupted channels ("uninterrupted" channels designed so that the air can get out) for de-airing in multiple (i.e., two or more) directions.

Preferably the pattern comprises protrusions of copolymer surrounded by channels.

In a preferred embodiment, the pattern comprises channels running in more than one direction through the film or sheet. In one preferred embodiment, the pattern comprises channels running in two directions. In one preferred embodiment, the pattern comprises channels running in two directions perpendicular to each other.

In one preferred embodiment, the encapsulant layer film and sheet of the present invention has an embossed pattern on each side (wherein the depth of the pattern on each side is in the range of from about 12 to about 20 micrometers). In a particularly preferred embodiment, there is an embossed pattern on one side of the encapsulant layer film and sheet that is orthogonal to the edges of the film and sheet, while the identical embossed pattern is slanted at some angle that is greater than or less than 90° to the edges: Offsetting the patterns in this manner can eliminate an undesirable optical effect in the film and sheeting.

In another preferred embodiment, the pattern comprises channels running in three or more directions.

The invention is also directed to a photovoltaic prelaminate assembly comprising solar cell(s) and at least one layer of the thermoplastic film or sheet.

The invention is further directed to a photovoltaic prelaminate assembly comprising an incident layer (preferably a layer of glass or other transparent material, especially a fluoropolymer film or poly(vinylidene fluoride) film), at least one layer of the thermoplastic film or sheet, solar cell(s), an additional layer comprising either a second layer of the thermoplastic film or sheet or another encapsulant layer, and a back sheet.

In addition, the invention is directed to a process of manufacturing a solar cell article with embedded solar cell(s) comprising the steps of (1) preparing a prelaminate assembly comprising an incident layer, at least one layer of thermoplastic film or sheet, the solar cell(s), an additional layer comprising either a second layer of the thermoplastic film or sheet or another encapsulant layer, and a back sheet, wherein the thermoplastic film or sheet has a thickness of about 1 mil (0.026 mm) to about 20 mils (0.51 mm) and contains a surface embossed layer comprising a copolymer of alpha olefin(s) with alpha, beta ethylenically unsaturated carboxylic acid comonomer(s), ionomers derived therefrom and combinations thereof, wherein the surface is embossed with a pattern which provides channels for de-airing; and (2) laminating the prelaminate assembly to form the solar cell article.

Further, the invention is directed to a process of manufacturing a solar cell article with embedded solar cell(s) comprising the steps of (1) preparing a prelaminate assembly comprising an incident layer, at least one layer of thermoplastic film or sheet, the solar cell(s), an additional layer comprising either a second layer of the thermoplastic film or sheet or another encapsulant layer, and a back sheet, wherein the thermoplastic film or sheet has a thickness of about 1 mil (0.026 mm) to about 20 mils (0.51 mm) and contains a surface embossed layer comprising a copolymer of alpha olefin(s) with alpha, beta ethylenically unsaturated carboxylic acid comonomer(s), ionomers derived therefrom and combinations thereof, wherein the surface is embossed with a pattern which provides channels for de-airing, the channels having depth of about 20 microns or less, a width of about 30 microns to about 300 microns and spaced about 0.1 mm to about 1 mm apart; and (2) laminating the prelaminate assembly to form the solar cell article. Preferably the channels have a depth of about 12 microns to about 20 microns, and wherein the copolymer is an ethylene (meth)acrylic acid copolymer containing about 10 to about 22 weight percent repeat units from (meth)acrylic acid, based on the total weight of the copolymer. In one preferred embodiment, the film or sheet is a monolayer sheet and the film or sheet is embossed with the pattern on both sides. In another preferred embodiment, the film or sheet is a multilayer film or sheet, preferably wherein the film or sheet is embossed through one or more layers.

Use of the present invention results in many advantages, such as less dirt accumulation, lower haze, and use of higher-efficiency de-airing and with less energy needed to compress the prelaminate when laminating (or at a controlled and desired level tailored for the pre-press/deairing process).

One example of a surface pattern of the present invention comprises projections upward from the base surface as well as voids, or depressions, in the encapsulant layer surface. Such projections and depressions would be of similar or the same volume, and located in close proximity to other such projections and voids on the encapsulant layer surface. The projections and depressions are preferentially located such that heating and compressing the encapsulant layer surface results in more localized flow of the thermoplastic material from an area of higher thermoplastic mass (that is, a projection) to a void area (that is, depression), wherein such voids would be filled with the mass from a local projection, resulting in the encapsulant layer surface being flattened. Localized flow of the thermoplastic resin material to obtain a flattened surface would require less of an energy investment than a more conventional pattern, which require flattening of a surface by effecting mass flow of thermoplastic material across the entire surface of the encapsulant layer. An important feature is the ability for the pattern to be flattened with relative ease as compared with the conventional art.

BRIEF DESCRIPTION OF THE DRAWINGS

The invention is illustrated by way of example and not limitation in the accompanying figures.

DETAILED DESCRIPTION OF THE INVENTION

All publications, patent applications, patents, and other references mentioned herein are incorporated by reference in their entirety. Unless otherwise defined, all technical and scientific terms used herein have the same meaning as commonly understood by one of ordinary skill in the art to which this invention belongs. In case of conflict, the present specification, including definitions, will control.

Except where expressly noted, trademarks are shown in upper case.

Although methods and materials similar or equivalent to those described herein can be used in the practice or testing of the present invention, suitable methods and materials are described herein.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

When the term "about" is used in describing a value or an end-point of a range, the disclosure should be understood to include the specific value or end-point referred to.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The transitional phrase "consisting of" excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. "A 'consisting essentially of' claim occupies a middle ground between closed claims that are written in a 'consisting of' format and fully open claims that are drafted in a 'comprising' format."

Where applicants have defined an invention or a portion thereof with an open-ended term such as "comprising," it should be readily understood that (unless otherwise stated) the description should be interpreted to also describe such an invention using the terms "consisting essentially of" or "consisting of."

Use of "a" or "an" are employed to describe elements and components of the invention. This is done merely for convenience and to give a general sense of the invention. This description should be read to include one or at least one and the singular also includes the plural unless it is obvious that it is meant otherwise.

In describing certain polymers it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers or that amount of the monomers, and the corresponding polymers and compositions thereof.

The materials, methods, and examples herein are illustrative only and, except as specifically stated, are not intended to be limiting.

In one embodiment, the present invention is an encapsulant sheet or film suitable for use in laminate structures comprising at least one solar cell. An encapsulant sheet or film of the present invention is used as a thermoplastic layer that can be heated and be caused to form an adhesive bond with other encapsulant layer materials, with flexible plastic materials, with rigid materials, and/or with the solar cell.

Polymers

The sheet or film, or the encapsulant layer, contains at least one layer comprising a copolymer of alpha olefin(s) with alpha, beta ethylenically unsaturated carboxylic acid comonomer(s), ionomers derived therefrom and combinations thereof.

The acid copolymers and the ionomers independently contain from about 1 to about 30 weight percent alpha, beta ethylenically unsaturated carboxylic acid comonomers based on the total weight of each copolymer. Preferably, the acid copolymers and the ionomers independently contain from about 5 to about 25 weight percent alpha, beta ethylenically unsaturated carboxylic acid comonomers based on the total weight of each copolymer based on enhanced adhesion and physical properties, such as higher flexural moduli and stiffness. More preferably, the acid copolymers and the ionomers independently contain from about 10 to about 22 weight percent alpha, beta ethylenically unsaturated carboxylic acid comonomers based on the total weight of each copolymer. The alpha olefin incorporates from 2 to 10 carbon atoms. Preferably, the alpha olefin may be selected from the group consisting of ethylene, propylene, 1-butene, 1-pentene, 1-hexene, 1-heptene, 3-methyl-1-butene, 4-methyl-1-pentene, and the like and mixtures thereof. More preferably, the alpha olefin is ethylene. Preferably, the alpha, beta ethylenically unsaturated carboxylic acid comonomers may be selected from the group consisting of acrylic acid, methacrylic acid, itaconic acid, maleic acid, maleic anhydride, fumaric acid, monomethyl maleic acid, and mixtures thereof. More preferably, the alpha, beta ethylenically unsaturated carboxylic acid comonomers are selected from the group consisting of acrylic acid, methacrylic acid and mixtures thereof.

The acid copolymers and the ionomers may optionally independently contain other unsaturated comonomers. Specific examples of preferable other unsaturated comonomers may be selected from the group consisting of; methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol)acrylate, poly(ethylene glycol)methacrylate, poly(ethylene glycol)methyl ether acrylate, poly (ethylene glycol)methyl ether methacrylate, poly(ethylene glycol)behenyl ether acrylate, poly(ethylene glycol)behenyl ether methacrylate, poly(ethylene glycol) 4-nonylphenyl ether acrylate, poly(ethylene glycol) 4-nonylphenyl ether methacrylate, poly(ethylene glycol)phenyl ether acrylate, poly(ethylene glycol)phenyl ether methacrylate, dimethyl maleate, diethyl maleate, dibutyl maleate, dimethyl fumarate, diethyl fumarate, dibutyl fumarate, dimenthyl fumarate, vinyl acetate, vinyl propionate, and the like and mixtures thereof. Preferably, the other unsaturated comonomers are selected from the group consisting of; methyl acrylate, methyl methacrylate, butyl acrylate, butyl methacrylate, glycidyl methacrylate, vinyl acetate, and mixtures thereof. Preferably, the acid copolymers and ionomers of the present invention incorporate between about 0 and about 50 weight percent of the other unsaturated comonomer, based on the total weight of the composition. More preferably, the acid copolymers and ionomers of the present invention incorporate between about 0 and about 30 weight percent of the other unsaturated comonomer, based on the total weight of the composition. Most preferably, the acid copolymers and ionomers of the present invention incorporate between about 0 weight percent and about 20 weight percent of the other unsaturated comonomer, based on the total weight of the composition. The acid copolymers of the present invention may be polymerized as disclosed, for example, in U.S. Pat. No. 3,404,134, U.S. Pat. No. 5,028,674, U.S. Pat. No. 6,500,888 and U.S. Pat. No. 6,518,365.

Neutralization

The acid copolymers may be neutralized from about 0 to about 100 percent with metallic ions based on the total carboxylic acid content to produce ionomers. The metallic ions may be monovalent, divalent, trivalent, multivalent, and mixtures therefrom. Preferable monovalent metallic ions may be selected from the group consisting of sodium, potassium, lithium, silver, mercury, copper, and the like and mixtures thereof. Preferable divalent metallic ions may be selected form the group consisting of beryllium, magnesium, calcium, strontium, barium, copper, cadmium, mercury, tin, lead, iron, cobalt, nickel, zinc, and the like and mixtures therefrom. Preferable trivalent metallic ions may be selected from the group consisting of aluminum, scandium, iron, yttrium, and the like and mixtures therefrom. Preferable multivalent metallic ions may be selected from the group consisting of titanium, zirconium, hafnium, vanadium, tantalum, tungsten, chromium, cerium, iron, and the like and mixtures therefrom. Preferably, when the metallic ion is multivalent, complexing agents, such as stearate, oleate, salicylate, and phenolate radicals are included, as disclosed within U.S. Pat. No. 3,404,134. More preferably, the metallic ion may be selected from the group consisting of sodium, lithium, magnesium, zinc, aluminum, and mixtures therefrom. Most preferably, the metallic ion may be selected from the group consisting of sodium, zinc, and mixtures therefrom. Preferably, the acid copolymers are neutralized from about 10 to about 90 percent with metallic ions based on the total carboxylic acid content. More preferably, the acid copolymers are neutralized from about 20 to 80 percent with metallic ions based on the total carboxylic acid content. The acid copolymers of the present invention may be neutralized as disclosed, for example, in U.S. Pat. No. 3,404,134.

Additives

The acid copolymer and ionomer compositions of the present invention may further incorporate additives which effectively reduce the melt flow of the resin, to the limit of producing thermoset films and sheets. The use of such additives will enhance the upper enduse temperature of the film and sheet and laminates of the present invention. Typically, the enduse temperature will be enhanced up to 20 to 70° C. In addition, laminates produced from such materials will be fire resistant. By reducing the melt flow of the acid copolymer and ionomer layer of the present invention, the material will have a reduced tendency to melt and flow out of the laminate and, in turn, serve as additional fuel for a fire. Specific examples of melt flow reducing additives include organic peroxides, such as 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy)hexane, dicumyl peroxide, alpha, alpha'-bis(tert-butylperoxyisopropyl)benzene, n-butyl-4,4-bis(tert-butylperoxy) valerate, 2,2-bis(tert-butylperoxy)butane, 1,1-bis(tert-butylperoxy)cyclohexane, 1,1-bis(tert-butylperoxy)-3,3,5-trimethyl-cyclohexane, tert-butyl peroxybenzoate, benzoyl peroxide, and the like and mixtures combinations thereof. Preferably the organic peroxide decomposes at a temperature of about 100° C. or higher to generate radicals. More preferably, the organic peroxides have a decomposition temperature which affords a half life of 10 hours at about 70° C. or higher to provide improved stability for blending operations. Typically, the organic peroxides will be added at a level of between about 0.01 to about 10 weight percent based on the total weight of the acid copolymer and ionomer composition. If desired, initiators, such as dibutyltin dilaurate, may be used. Typically, initiators are added at a level of from about 0.01 weight percent to about 0.05 weight percent based on the total weight of the acid copolymer and ionomer composition. If desired, inhibitors, such as hydroquinone, hydroquinone monomethyl ether, p-benzoquinone, and methylhydroquinone, may be added for the purpose of enhancing control to the reaction and stability. Typically, the inhibitors would be added at a level of less than about 5 weight percent based on the total weight of the acid copolymer and ionomer composition.

It is understood that the compositions of the present invention can be used with additives known within the art. The additives can include plasticizers, processing aides, flow enhancing additives, lubricants, pigments, dyes, flame retardants, impact modifiers, nucleating agents to increase crystallinity, antiblocking agents such as silica, thermal stabilizers, UV absorbers, UV stabilizers, dispersants, surfactants, chelating agents, coupling agents, adhesives, primers, reinforcement additives, such as glass fiber, fillers and the like. For example, typical colorants can include a bluing agent to reduce yellowing. Generally, additives which reduce the optical clarity of the acid copolymer or ionomer layer, such as reinforcement additives and fillers, are reserved for back sheet uses behind the solar cell as to not reduce the overall efficiency of the solar cell module.

The compositions of the present invention can incorporate an effective amount of a thermal stabilizer. Thermal stabilizers are well known in the art. Any known thermal stabilizer will find utility within the present invention. Preferable general classes of thermal stabilizers include phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds which destroy peroxide, hydroxylamines, nitrones, thiosynergists, benzofuranones, indolinones, and the like and mixtures thereof. This should not be considered limiting. Essentially any thermal stabilizer known within the art will find utility within the present invention. The compositions of the present invention preferably incorporate from about 0 to about 10.0 weight percent thermal stabilizers, based on the total weight of the composition. More preferably, the compositions of the present invention incorporate from about 0 to about 5.0 weight percent thermal stabilizers, based on the total weight of the composition. Most preferably, the compositions of the present invention incorporate from about 0 to about 1.0 weight percent thermal stabilizers, based on the total weight of the composition.

The compositions of the present invention may incorporate an effective amount of UV absorbers. UV absorbers are well disclosed within the art. Any known UV absorber will find utility within the present invention. Preferable general classes of UV absorbers include benzotriazoles, hydroxybenzophenones, hydroxyphenyl triazines, esters of substituted and unsubstituted benzoic acids, and the like and mixtures thereof. This should not be considered limiting. Essentially any UV absorber known within the art will find utility within the present invention. The compositions of the present invention preferably incorporate from about 0 to about 10.0 weight percent UV absorbers, based on the total weight of the composition. More preferably, the compositions of the present invention incorporate from about 0 to about 5.0 weight percent UV absorbers, based on the total weight of the composition. Most preferably, the compositions of the present invention incorporate from about 0 to about 1.0 weight percent UV absorbers, based on the total weight of the composition.

The compositions of the present invention may incorporate an effective amount of hindered amine light stabilizers, (HALS). Hindered amine light stabilizers, (HALS), are generally well disclosed within the art. Generally, hindered amine light stabilizers are disclosed to be secondary, tertiary, acetylated, N-hydrocarbyloxy substituted, hydroxy substituted N-hydrocarbyloxy substituted, or other substituted cyclic amines which further incorporate steric hindrance, generally derived from aliphatic substitution on the carbon atoms adjacent to the amine function. This should not be considered limiting, essentially any hindered amine light stabilizer known within the art may find utility within the present invention. The compositions of the present invention preferably incorporate from about 0 to about 10.0 weight percent hindered amine light stabilizers, based on the total weight of the composition. More preferably, the compositions of the present invention incorporate from about 0 to about 5.0 weight percent hindered amine light stabilizers, based on the total weight of the composition. Most preferably, the compositions of the present invention incorporate from about 0 to about 1.0 weight percent hindered amine light stabilizers, based on the total weight of the composition.

Multilayer Encapsulant Layer

In another embodiment, the present invention is a multilayer encapsulant layer incorporating at least one surface layer comprising a polymer selected from the group consisting essentially of certain acid copolymer compositions, ionomers derived therefrom and combinations thereof, as described above.

Multilayer films and sheets may be bilayer, trilayer, and multilayer film and sheet structures. One advantage to multilayer films and sheets is that specific properties can be tailored into the film and sheet to solve critical use needs while allowing the more costly ingredients to be relegated to the outer layers where they provide the greater needs. The multilayer films of the present invention may be varied through each layer's composition, each layer's thickness and the positioning of the various layers within the multilayer film or sheet. For example, in a trilayer construct, the copolymers of this invention may be the surface layers serving to enhance the adhesion, optical clarity, antiblock or physical properties, while the middle layer may provide optical clarity, structural support, shock absorbance, and the like or simply to provide a more cost efficient structure.

The other layers in the multilayer films or sheets of the present invention may be formed from any material known. Preferably, the other layers are selected from the group consisting essentially of acid copolymer composition, ionomers, ethylene vinyl acetate compositions, polyolefins, polyethylenes, metallocene-catalyzed polyolefins, metallocene-catalyzed polyethylenes, ethylene (meth)acrylate copolymers, polyamides, polyesters, poly(vinyl chloride) compositions, poly(vinyl butyral) compositions, polyurethanes, fluoropolymers, silicone polymers and combinations thereof. Generally, the multilayer films and sheets are produced through extrusion casting, blown film, adhesive lamination or extrusion lamination processes. The most preferred embodiment comprises ethylene vinyl acetate, ionomer, or ethylene acrylate ester copolymers such as ethylene co-methyl acrylate, ethylene co-methyl methacrylate, ethylene co-butyl-acrylate or ethylene co-methyl-acrylate.

In one preferred embodiment, the film or sheet comprises one layer. In another preferred embodiment, the film or sheet is multilayer, preferably with one or both outside layers comprising ionomer. The most preferred multilayer film or sheet comprises three layers, preferably with one or both outside layers comprising ionomer. Two layer films or sheets are also preferred, and can have one or both layers comprising ionomer.

The thickness of the other film or sheet may be varied depending on the particular application. Preferably, the thickness of the film and sheet will range from about 1 mils (0.026 mm), to about 25 mils (0.64 mm). More preferably the thickness of the film and sheet will range from about 1 mil, (0.026 mm), and about 20 mils, (0.51 mm). For the multilayer film and sheets, the thickness of each layer may be varied depending on the particular function of each layer and the particular application of the multilayer film and sheet.

Surface Treatment

If desired, one or both surfaces of the film and sheet may be treated to enhance the adhesion to other laminate layers. This treatment may take any form known within the art, including adhesives, primers, such as silanes, flame treatments, such as disclosed within U.S. Pat. No. 2,632,921, U.S. Pat. No. 2,648,097, U.S. Pat. No. 2,683,894, and U.S. Pat. No. 2,704,382, plasma treatments, such as disclosed within U.S. Pat. No. 4,732,814, electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of the polymeric film through vacuum sputtering as disclosed in U.S. Pat. No. 4,865,711. For example, U.S. Pat. No. 5,415,942 discloses a hydroxy-acrylic hydrosol primer coating that may serve as an adhesion-promoting primer for poly(ethylene terephthalate) films.

Solar Cell Efficiency

The efficiency of the solar cell module is related to the appearance and transparency of the transparent frontsheet portion of the solar cell laminates such as those described in the present invention, or of conventional solar cell laminates, and is an important feature in assessing the desirability of using the laminates. As described above, the frontsheet portion of the solar cell laminate includes the top incident layer, the frontsheet encapsulant layer, the voltage-generating solar cell and any other layers which are incorporated between the incident layer and the solar cell device. One factor affecting the appearance of the frontsheet portion of the solar cell laminates is whether the laminate includes trapped air or air bubbles that develop between the encapsulant layer and the surface of the glass and/or the solar cell, for example. It is desirable to remove air in an efficient manner during the lamination process. Providing channels for the escape of air and removing air during lamination is a known method for obtaining laminates having acceptable appearance.

This can be affected by mechanically embossing or by melt fracture during extrusion of the encapsulant layer sheet followed by quenching so that the roughness is retained during handling. Retention of the surface roughness is essential in the practice of the present invention to facilitate effective deaeration of the entrapped air during laminate preparation.

Surface Roughness

Surface roughness, Rz, can be expressed in microns by a 10-point average roughness in accordance with ISO-R468 of the International Organization for Standardization and ASMEB46.1 of the American Society of Mechanical Engineers. For sheeting having a thickness of the present invention, 10-point average roughness, Rz, of up to 80 µm is sufficient to prevent air entrapment. The width of the channels is preferably from about 30 µm to about 300 µm, more preferably from about 40 to about 250 µm, and most preferably from about 50 to about 200 µm. The surface channels are preferably spaced between from about 0.1 mm to about 1 mm apart, more preferably from about 0.1 to about 0.9 mm apart, most preferably from about 0.15 to about 0.85 mm apart.

Surface roughness, Rz, measurements from single-trace profilometer measurements can be adequate in characterizing the average peak height of a surface with roughness peaks and valleys that are nearly randomly distributed. However a single trace profilometer may not be sufficient in characterizing the texture of a surface that has certain regularities, particularly straight lines. In characterizing such surfaces, if care is taken such that the stylus does not ride in a groove or on a plateau, the Rz thus obtained can still be a valid indication of the surface roughness. Other surface parameters, such as the mean spacing (R Sm) may not be accurate because they depend on the actual path traversed. Parameters like R Sm can change depending on the angle the traversed path makes with the grooves. Surfaces with regularities like straight-line grooves are better characterized by three-dimensional or area roughness parameters such as the area peak height, $AR_p$, and the total area roughness, $AR_t$, and the area kurtosis (AKu) as defined in ASME B46.1. $AR_p$ is the distance between the highest point in the roughness profile over an area to the plane if all the material constituting the roughness is melted down. $AR_t$ is the difference in elevation between the highest peak and the lowest valley in the roughness profile over the area measured. In the invention, the surface pattern of the encapsulant layer is characterized by $AR_t$ less than 32 µm, and the ratio of $AR_p$ to $AR_t$, also defined in ASME B46.1-1, is between 0.42 and 0.62, preferably 0.52 to 0.62. The encapsulant layer also has area kurtosis of less than about 5.

Pattern

The surface pattern is preferably an embossed pattern with a channel depth of 20 micrometers or less. Preferably the channel depth is in the range of from about 12 to about 20 micrometers, and most preferably in the range of from about 14 to about 20 micrometers. The depth is preferably selected so that the regular channels provide suitable paths for air to escape during the lamination process. It is desirable therefore that the depth be sufficiently deep that the air pathways are not cut off prematurely during the heating stage of the lamination process, leading to trapped air in the laminate when it cools. Also, particularly when using the higher modulus encapsulant layers of the present invention, it can be desirable to provide relatively shallow channels in comparison to, for example, EVA or PVB interlayer surface patterns. Larger channels provide larger reservoirs for air, and hence more air that requires removal during lamination.

Figure 1:
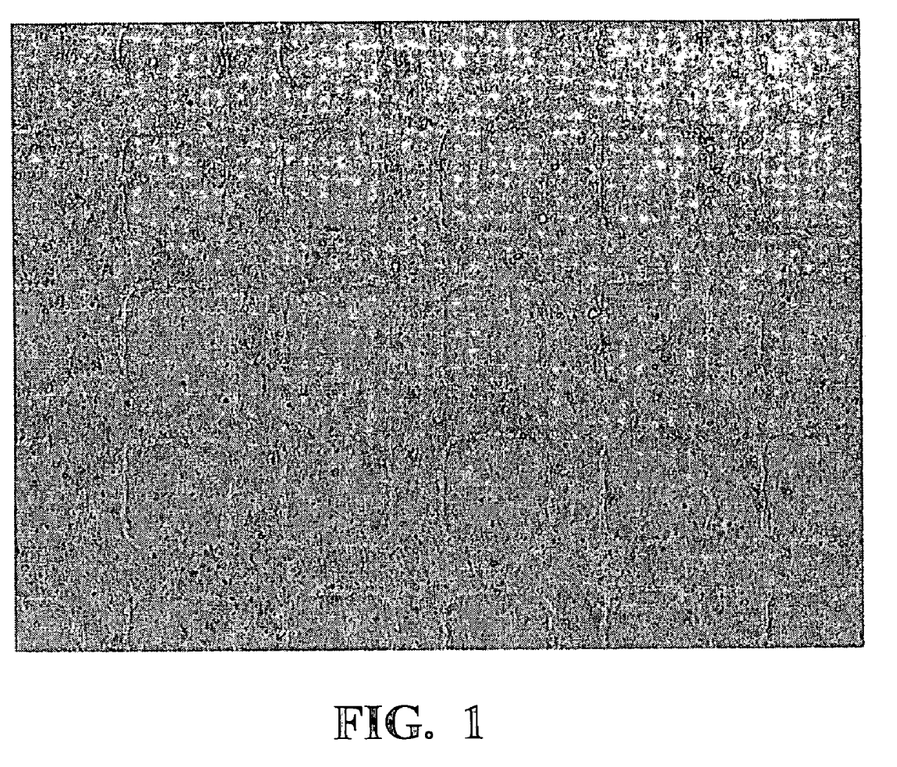
FIG. 1 is a photomicrograph of a preferred embossed surface having a pattern with protrusions having a mound average width of 0.350 mm, a valley average width of 0.136 mm, and a valley average depth of 15.0 microns.
Figure 3:
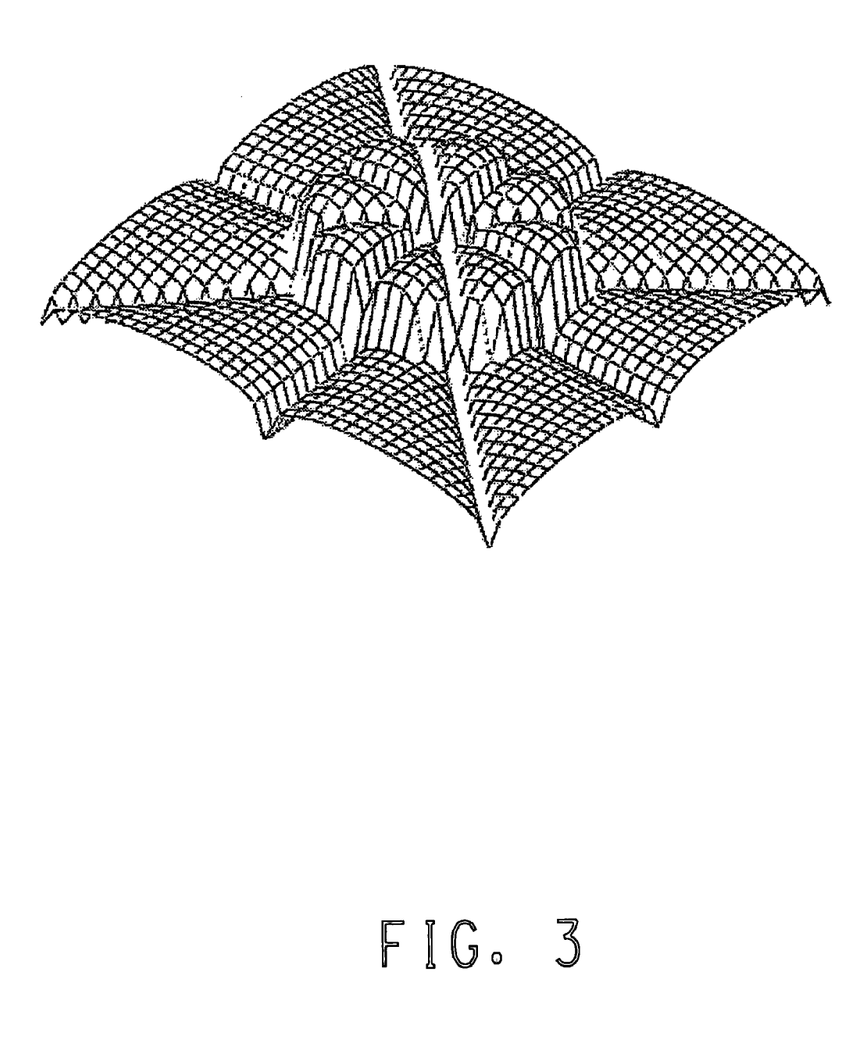
FIG. 3 shows an alternative surface pattern that can be used according to the claimed invention. The raised areas and deairing recesses are not shown to scale.

It should be noted that the pattern preferably contains channels in two or more directions. The preferred embodiments contain channels in two directions, preferably (in one embodiment) perpendicular to each other, such as shown in FIG. 1. Other embodiments can have channels in three or more directions, such as shown in FIG. 3.

The encapsulant layer film and sheet can be embossed on one or both sides. The embossing pattern and/or the depth thereof can be asymmetric with respect to the two sides of the encapsulant layer film and sheet. That is, the embossed patterns can be the same or different, as can be the depth of the pattern on either side of the film and sheet. In a preferred embodiment, the encapsulant layer film and sheet of the present invention has an embossed pattern of each side wherein the depth of the pattern on each side is in the range of from about 12 to about 20 micrometers. In a particularly preferred embodiment, there is an embossed pattern on one side of the encapsulant layer film and sheet that is orthogonal to the edges of the film and sheet, while the identical embossed pattern is slanted at some angle that is greater than or less than 90° to the edges, and the depth of the embossed patterns is in the range of from about 12 to about 20 micrometers. Offsetting the patterns in this manner can eliminate an undesirable optical effect in the film and sheeting.

In another embodiment, a surface pattern can be applied using a tool that imparts a pattern wherein the pattern requires less energy to obtain a flattened surface than conventional patterns. In the process of the present invention it is necessary to flatten the surface of the encapsulant layer during the lamination, in order that the encapsulant layer surface be in complete contact with the opposing surface to which it is being laminated when the lamination process is complete. The energy required to obtain a smooth or flattened surface can vary depending upon the surface topography, as well as the type of material being flattened.

Conventional surface patterns or textures require a large percentage of the volume of the material that is raised above the imaginary plane of the flattened encapsulant layer sheet to flow to areas that lie below the imaginary plane. Encapsulant layer material that is above (primarily) and below the plane (which is the interface of the encapsulant layer and the layer to which it is being laminated to, (such as the solar cell, for example), after the lamination step is complete) must flow through a combination of heat, atmospheric (about 1,000 milibar) or applied pressure, and time. Each particular pattern of different peak heights, spacing, volume, and other descriptors necessary to define the surface geometry will yield a corresponding amount of work or energy to compress the surface pattern. The goal is to prevent premature contact or sealing to occur prior to sufficient air removal being accomplished whether air removal is to be achieved by conventional techniques such as roll pre-pressing or vacuum bags/rings and the like.

In this embodiment a film or sheet having a surface roughness that allows for high-efficiency deairing but with less energy for compression (or at a controlled and desired level tailored for the pre-press/deairing process) is obtained. One example of a surface pattern of the present invention comprises projections upward from the base surface as well as voids, or depressions, in the encapsulant layer surface. Such projections and depressions would be of similar or the same volume, and located in close proximity to other such projections and voids on the encapsulant layer surface. The projections and depressions are preferentially located such that heating and compressing the encapsulant layer surface results in more localized flow of the thermoplastic material from an area of higher thermoplastic mass (that is, a projection) to a void area (that is, depression), wherein such voids would be filled with the mass from a local projection, resulting in the encapsulant layer surface being flattened. Localized flow of the thermoplastic resin material to obtain a flattened surface would require less of an energy investment than a more conventional pattern, which require flattening of a surface by effecting mass flow of thermoplastic material across the entire surface of the encapsulant layer. The main feature is the ability for the pattern to be flattened with relative ease as compared with the conventional art.

Several different criteria are important in the design of an appropriate surface pattern or texture for sheeting handling, ease of positioning, blocking tendency, ease of cleaning, deairing and possessing a robust process window for laminate manufacture.

The ethylene acid copolymer resin compositions may be formed into polymeric sheets through the processes described above. The surface pattern, as described above, may be applied to the film or sheet through common art processes. For example, the as extruded film or sheet may be passed over a specially prepared surface of a die roll positioned in close proximity to the exit of the die which imparts the desired surface characteristics to one side of the molten polymer. Thus, when the surface of such roll has minute peaks and valleys, film or sheet formed of polymer cast thereon will have a rough surface on the side which contacts the roll which generally conforms respectively to the valleys and peaks of the roll surface. Such die rolls are disclosed in, for example, U.S. Pat. No. 4,035,549. As is known, this rough surface is only temporary and particularly functions to facilitate deairing during laminating after which it is melted smooth from the elevated temperature and pressure associated with autoclaving and other lamination processes.

Solar (Photovoltaic) Cells

Solar (photovoltaic) cells are commonly available on an ever increasing variety as the technology evolves and is optimized. Within the present invention, a solar cell is meant to include any article which can convert light into electrical energy. Typical art examples of the various forms of solar cells include, for example; single crystal silicon solar cells; polycrystal silicon solar cells; microcrystal silicon solar cells; amorphous silicon based solar cells; copper indium selenide solar cells; compound semiconductor solar cells; dye sensitized solar cells; and the like. The most common types of solar cells include crystalline solar cells (e.g., thin film solar cells), compound semiconductor solar cells and amorphous silicon solar cells due to relatively low cost manufacturing ease for large scale solar cells.

The solar cell laminates may incorporate other encapsulant layers, rigid sheet layers and film layers.

The other encapsulant layers may be any known within the art, such as prepared from the acid copolymers and ionomers of the present invention or from any of the above mentioned other layer materials for the multilayer films or sheets of the present invention. The other encapsulant layers may have smooth or roughened (embossed) surfaces.

The laminates of the present invention may additionally incorporate one or more rigid sheet layers. The rigid sheet may be glass or rigid plastic sheets, such as, for example, polycarbonate, acrylics, polyacrylate, cyclic polyolefins, such as ethylene norbornene polymers, metallocene-catalyzed polystyrene, polyamides, polyesters, fluoropolymers and the like and combinations thereof. Metal, such as aluminum, steel or galvanized steel, or ceramic plates may be substituted for the rigid polymeric sheet or glass, and utilized as a supportive backsheet.

The term "glass" is meant to include not only window glass, plate glass, silicate glass, sheet glass, low iron glass and float glass, but also includes colored glass, specialty glass which includes ingredients to control, for example, solar heating, coated glass with, for example, sputtered metals, such as silver or indium tin oxide, for solar control purposes, E-glass, Toroglass, Solex® glass and the like. Such specialty glasses are disclosed in, for example, U.S. Pat. No. 4,615,989, U.S. Pat. No. 5,173,212, U.S. Pat. No. 5,264,286, U.S. Pat. No. 6,150,028, U.S. Pat. No. 6,340,646, U.S. Pat. No. 6,461,736, and U.S. Pat. No. 6,468,934. While untextured glass can be used, textured glass is often used to facilitate air removal. The type of glass to be selected for a particular laminate depends on the intended use.

The rigid sheets, for example, may serve as the solar cell laminate front sheet, such as the glass sheet, or may serve as the structural back sheet, such as the galvanized steel.

The laminates of the present invention may incorporate film layers. The film layer may be metal, such as aluminum foil, or polymeric. Preferable polymeric film materials include; poly(ethylene terephthalate), polycarbonate, polypropylene, polyethylene, polypropylene, cyclic polyloefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, polyvinyl fluoride, polyvinylidene fluoride, polytetrafluoroethylene, ethylene-tetrafluoroethylene copolymers and the like. Most preferably, the polymeric film is biaxially oriented poly(ethylene terephthalate) (PET) film, aluminum foil or a fluoropolymer film, such as Tedlar® or Tefzel® films, which are commercial products of the DuPont Company.

Preferably, one or both surfaces of the film may be treated to enhance the adhesion to the other laminate layers. This treatment may take any form known within the art, including adhesives, primers, such as silanes, flame treatments, such as disclosed within U.S. Pat. No. 2,632,921, U.S. Pat. No. 2,648,097, U.S. Pat. No. 2,683,894, and U.S. Pat. No. 2,704,382, plasma treatments, such as disclosed within U.S. Pat. No. 4,732,814, electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of the polymeric film through vacuum sputtering as disclosed in U.S. Pat. No. 4,865,711. For example, U.S. Pat. No. 5,415,942 discloses a hydroxy-acrylic hydrosol primer coating that may serve as an adhesion-promoting primer for poly(ethylene terephthalate) films.

Preferably, the polymeric film of the present invention includes a primer coating on one or both surfaces, more preferably both surfaces, comprising a coating of a polyallylamine-based primer. The polyallylamine-based primer and its application to a poly(ethylene terephthalate) polymeric film are disclosed within U.S. Pat. No. 5,411,845, U.S. Pat. No. 5,770,312, U.S. Pat. No. 5,690,994, and U.S. Pat. No. 5,698,329. Generally, the poly(ethylene terephthalate) film is extruded and cast as a film by conventional methods, as described above, and the polyallylamine coating is applied to the poly(ethylene terephthalate) film either before stretching or between the machine direction stretching and transverse direction stretching operations, and/or after the two stretching operations and heat setting in the stenter oven. It is preferable that the coating be applied before the transverse stretching operation so that the coated poly(ethylene terephthalate) web is heated under restraint to a temperature of about 220° C. in the stenter oven in order to cure the polyallylamine to the poly(ethylene terephthalate) surface(s). In addition to this cured coating, an additional polyallylamine coating can be applied on it after the stretching and stenter oven heat setting in order to obtain a thicker overall coating.

The thickness of the polymeric film is not critical and may be varied depending on the particular application. Generally, the thickness of the polymeric film will range from about 0.1 mils (0.003 mm), to about 10 mils (0.26 mm). The polymeric film thickness may be preferably within the range of about 1 mil (0.025 mm), to about 4 mils (0.1 mm).

The polymeric film is preferably sufficiently stress-relieved and shrink-stable under the coating and lamination processes. Preferably, the polymeric film is heat stabilized to provide low shrinkage characteristics when subjected to elevated temperatures (i.e. less than 2 percent shrinkage in both directions after 30 minutes at 150° C.), such are seen through the lamination processes described below.

The film may be coated if desired. For example, the coating may function as oxygen and moisture barrier coatings, such as the metal oxide coating disclosed within, for example, U.S. Pat. No. 6,521,825, U.S. Pat. No. 6,818,819 and EP 1 182 710. These barrier coatings protect the solar cell from moisture, sodium, oxygen and the like.

The films, for example, may serve as the solar cell laminate front sheet, such as the fluoropolymer or poly(ethylene terephthalate) film; may serve as the back sheet, such as the aluminum foil, fluoropolymer or poly(ethylene terephthalate) film; may serve as a dielectric layer between the solar cell and a galvanized steel or aluminum foil backsheet and/or may serve as a barrier layer, for example, as an oxygen or moisture barrier layer.

If desired, a layer of non-woven glass fiber (scrim) may be utilized within the solar cell laminate, for example, to facilitate de-airing during the lamination process or to serve as a reinforcement for the encapsulant layer(s). The use of such scrim layers within solar cell laminates is disclosed within, for example, U.S. Pat. No. 5,583,057, U.S. Pat. No. 6,075,202, U.S. Pat. No. 6,204,443, U.S. Pat. No. 6,320,115, U.S. Pat. No. 6,323,416 and EP 0 769 818.

Any of the layers of the solar cell laminate, (such as, for example, the glass), may have a layer of adhesive or primers to enhance the bond strength between the laminate layers, if desired. The adhesive layer preferably takes the form of a coating. The adhesive/primer coating is less than 1 mil thick. Preferably, the adhesive/primer coating is less than 0.5 mil thick. More preferably, the adhesive/primer coating is less than 0.1 mil thick. The adhesive may be any adhesive or primer known within the art. Preferably, the adhesive or primer is a silane which incorporates an amine function. Specific examples of such materials include, for example; gamma-aminopropyltriethoxysilane, N-beta-(aminoethyl)-gamma-aminopropyl-trimethoxysilane, and the like and mixtures thereof. Commercial examples of such materials include, for example A-1100® silane, (from the Silquest Company, formerly from the Union Carbide Company, believed to be gamma-aminopropyltrimethoxysilane) and Z6020® silane, (from the Dow Company).

The adhesives may be applied through melt processes or through solution, emulsion, dispersion, and the like, coating processes. One of ordinary skill in the art will be able to identify appropriate process parameters based on the composition and process used for the coating formation. The above process conditions and parameters for making coatings by any method in the art are easily determined by a skilled artisan for any given composition and desired application. For example, the adhesive or primer composition can be cast, sprayed, air knifed, brushed, rolled, poured or printed or the like onto the surface. Generally the adhesive or primer is diluted into a liquid medium prior to application to provide uniform coverage over the surface. The liquid media may function as a solvent for the adhesive or primer to form solutions or may function as a non-solvent for the adhesive or primer to form dispersions or emulsions. Adhesive coatings may also be applied by spraying the molten, atomized adhesive or primer composition onto the surface. Such processes are disclosed within the art for wax coatings in, for example, U.S. Pat. No. 5,078,313, U.S. Pat. No. 5,281,446, and U.S. Pat. No. 5,456,754.

Module Layers

The solar cell laminate may take any form known within the art. Preferable specific solar cell laminate constructions (top (light incident) side to back side) include, for example, glass/encapsulant layer/solar cell/encapsulant layer/glass; glass/encapsulant layer/solar cell/encapsulant layer/Tedlar® film; Tedlar® film/encapsulant layer/solar cell/encapsulant layer/glass; Tedlar® film/encapsulant layer/solar cell/encapsulant layer/Tedlar® film; glass/encapsulant layer/solar cell/encapsulant layer/PET film; Tedlar® film/encapsulant layer/solar cell/encapsulant layer/PET film; glass/encapsulant layer/solar cell/encapsulant layer/aluminum foil; Tedlar® film/encapsulant layer/solar cell/encapsulant layer/aluminum foil; glass/encapsulant layer/solar cell/encapsulant layer/galvanized steel sheet; glass/encapsulant layer/solar cell/encapsulant layer/PET film/encapsulant layer/aluminum foil; Tedlar® film/encapsulant layer/solar cell/encapsulant layer/PET film/encapsulant layer/aluminum foil; glass/encapsulant layer/solar cell/encapsulant layer/PET film/encapsulant layer/galvanized steel sheet; Tedlar®/encapsulant layer/solar cell/encapsulant layer/PET film/encapsulant layer/galvanized steel sheet and the like.

Manufacture

The processes to produce the solar cell laminates of the present invention may take many forms and may be produced through any known art process. The solar cell laminates of the present invention may also be produced through autoclave and non-autoclave processes, as described below. For example, the solar cell constructs described above may be laid up in a vacuum lamination press and laminated together under vacuum with heat and pressure Alternatively, the solar cell laminates may be formed by conventional autoclave processes such as those known within the art. For example, in a typical process, a glass sheet, an encapsulant layer, a solar cell, a second encapsulant layer and Tedlar® film, and a cover glass sheet are laminated together under heat and pressure and a vacuum (for example, in the range of about 27-about 28 inches (about 689-about 711 mm) Hg), to remove air. Preferably, the glass sheet has been washed and dried. A typical glass type is about 90 mil thick annealed low iron glass. In a typical procedure, the laminate assembly of the present invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 130° C. to about 180° C., at a pressure of about 200 psi (about 15 bars), for from about 10 to about 50 minutes. Preferably the bag is autoclaved at a temperature of from about 120° C. to about 160° C. for 20 minutes to about 45 minutes. More preferably the bag is autoclaved at a temperature of from about 135° C. to about 160° C. for about 20 minutes to about 40 minutes. Most preferably the bag is autoclaved at a temperature of from about 145° C. to about 155° C. for about 25 minutes to about 35 minutes. A vacuum ring may be substituted for the vacuum bag. One type of vacuum bags is disclosed within U.S. Pat. No. 3,311,517.

Alternatively, other processes may be used to produce the solar cell laminates of the present invention. Any air trapped within the laminate assembly may be removed through a nip roll process. For example, the laminate assembly may be heated in an oven at about 80 to about 120° C., preferably about 90 to about 100° C., for about 30 minutes. Thereafter, the heated laminate assembly is passed through a set of nip rolls so that the air in the void spaces between the solar cell outside layers, the solar cell and the encapsulant layer may be squeezed out, and the edge of the assembly sealed. This process may provide the final solar cell laminate or may provide what is referred to as a pre-press assembly, depending on the materials of construction and the exact conditions utilized.

The pre-press assembly may then placed in an air autoclave where the temperature is raised to about 120° C. to about 160° C., preferably to about 135° C. to about 160° C., and pressure of about 100 to about 300 psig, preferably about 200 psig (about 14.3 bar). These conditions are maintained for about 15 minutes to about 1 hour, preferably about 20 minutes to about 50 minutes, after which, the air is cooled while no more air is added to the autoclave. After about 20 minutes of cooling, the excess air pressure is vented and the solar cell laminates are removed from the autoclave. This should not be considered limiting. Essentially any lamination process known within the art may be used with the interlayers of the present invention.

The laminates of the present invention may also be produced through non-autoclave processes. Such non-autoclave processes are disclosed, for example, within U.S. Pat. No. 3,234,062, U.S. Pat. No. 3,852,136, U.S. Pat. No. 4,341,576, U.S. Pat. No. 4,385,951, U.S. Pat. No. 4,398,979, U.S. Pat. No. 5,536,347, U.S. Pat. No. 5,853,516, U.S. Pat. No. 6,342,116, U.S. Pat. No. 5,415,909, US 2004/0182493, EP 1 235 683 B1, WO 91/01880 and WO 03/057478 A1. Generally, the non-autoclave processes include heating the laminate assembly or the pre-press assembly and the application of vacuum, pressure or both. For example, the pre-press may be successively passed through heating ovens and nip rolls.

FIG. 1 is a photomicrograph of a preferred embossed surface having a pattern with protrusions having a mound average width of 0.350 mm, a valley average width of 0.136 mm, and a valley average depth of 15.0 microns.

Figure 2:
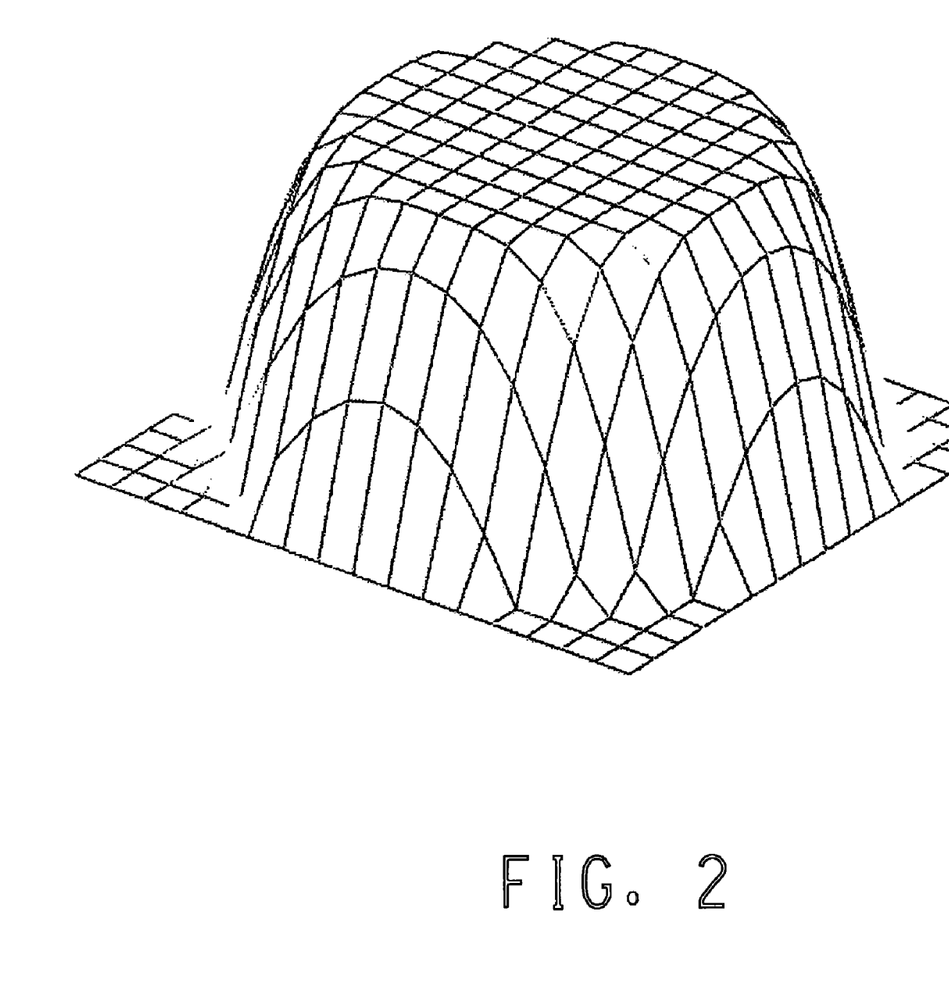
FIG. 2 is drawing (not to scale) of surface protrusion as a "raised" volume of polymer.

FIG. 2 is a drawing (not to scale) of surface protrusion as a "raised" volume of polymer.

FIG. 3 shows an alternative surface pattern that can be used according to the claimed invention. The raised areas and deairing recesses are not shown to scale.

As desired, the edges of the solar cell laminate may be sealed to reduce moisture and air intrusion and their potentially degradation effect on the efficiency and lifetime of the solar cell by any means disclosed within the art. General art edge seal materials include, for example, butyl rubber, polysulfide, silicone, polyurethane, polypropylene elastomers, polystyrene elastomers, block elastomers, (SEBS), and the like.

EXAMPLES

The following Examples and Comparative Examples are intended to be illustrative of the present invention, and are not intended in any way to limit the scope of the present invention.

Example 1

The embossed sheet structures noted below in Table 1 were prepared on a 24 inch width Sano multilayer coextrusion line equipped with embossing rolls utilizing common art sheet formation processes. This essentially entailed the use of an extrusion line consisting of a twin-screw extruder with a sheet die feeding melt into a roll stack. The rolls have an embossed surface pattern engraved into the metal surface which imparts to varying degrees a reverse image of the surface texture onto the polymer melt as it passes between and around the textured rolls. Both surfaces of the sheet were embossed with a pattern with the following characteristics; Mound average depth 21+/−4 micron; Mound peak depth 25+/−5 micron; Pattern frequency/mm 2; Mound width mm 0.350+/−0.02 mm; and Valley width 0.140+/−0.02 mm.

Surface roughness, Rz, can be expressed in microns by a 10-point average roughness in accordance with ISO-R468 of the International Organization for Standardization. Roughness measurements are made using a stylus-type profilometer (Surfcom 1500A manufactured by Tokyo Seimitsu Kabushiki Kaisha of Tokyo, Japan) as described in ASME B46.1-1995 using a trace length of 26 mm. $AR_p$ and $AR_t$, and the area kurtosis are measured by tracing the roughness over a 5.6 mm×5.6 mm area in 201 steps using the Perthometer Concept system manufactured by Mahr GmbH, Gottingen, Germany. The sheet was found to have an Rz in the range of from about 15 micron to about 25 micron.

TABLE 1

Trilayer Sheet Structures.

| Example | Outer Layers (1 mil (0.026 mm) thick) | Inner Layer (16 mils (0.4 mm) thick) |
| --- | --- | --- |
| A | Ionomer 1 | Ionomer 1 |
| B | Ionomer 2 | Ionomer 2 |
| C | Ionomer 3 | Ionomer 3 |
| D | Ionomer 4 | Ionomer 4 |
| E | Blend 1 | Blend 1 |
| F | Blend 2 | Blend 2 |
| G | Blend 3 | Blend 3 |
| H | Blend 4 | Blend 4 |

Ionomer 1 was a poly(ethylene-co-methacrylic acid) with 15 weight percent methacrylic acid and neutralized with 21 percent zinc ion with a MI of 5 g/10 minutes, (190 C., ISO 1133, ASTM D1238).
Ionomer 2 was a poly(ethylene-co-methacrylic acid) with 15 weight percent methacrylic acid and neutralized with 22 percent zinc ion with a MI of 14 g/10 minutes, (190 C., ISO 1133, ASTM D1238).
Ionomer 3 was a poly(ethylene-co-methacrylic acid) with 19 weight percent methacrylic acid and neutralized with 37 percent sodium ion with a MI of 2 g/10 minutes, (190 C., ISO 1133, ASTM D1238).
Ionomer 4 was a poly(ethylene-co-methacrylic acid) with 19 weight percent methacrylic acid and neutralized with 36 percent zinc ion with a MI of 1 g/10 minutes, (190 C., ISO 1133, ASTM D1238).
Ionomer 5 was a poly(ethylene-co-methacrylic acid) with 19 weight percent methacrylic acid and neutralized with 39 percent zinc ion with a MI of 4 g/10 minutes, (190 C., ISO 1133, ASTM D1238).
Blend 1 contains 75 weight percent of Ionomer 1 and 25 weight percent of Ionomer 3.
Blend 2 contains 75 weight percent of Ionomer 1 and 25 weight percent of Ionomer 4.
Blend 3 contains 90 weight percent of Ionomer 1 and 10 weight percent of Ionomer 5.
Blend 4 contains 75 weight percent of Ionomer 1 and 25 weight percent of Ionomer 5.

A variety of laminate structures (4 inch by 4 inch) were produced from each embossed sheet described above to demonstrate various solar cell structures. The laminate structures included glass/Example/glass, fluoropolymer film/Example/glass, aluminum sheet/Example/glass, aluminum film/Example and glass/Example. The glass used was ⅛ inch thick (3.2 mm) Starphire® glass sheet, (a commercial product of the PPG Corporation), the fluoropolymer film was 1.5 mil thick (0.38 mm) corona surface treated Tedlar® grade WH15BL3, (a product of the DuPont Company), and the aluminum sheet was ⅛ inch thick (3.2 mm) and was 5052 alloyed with 2.5 weight percent magnesium and conformed to Federal specification QQ-A-250/8 and ASTM B209.

The laminate structures described above were stacked (laid up) to form the prelaminate structures. The prelaminate structure was then placed within a vacuum bag, the vacuum bag was sealed, placed into an oven at room temperature, (25° C.+/−5° C.), and a vacuum was applied to remove the air from the vacuum bag. While maintaining the application of the vacuum to the vacuum bag, the vacuum bag was heated at 135° C. for 1 hour. The vacuum was then discontinued. The vacuum bag was then removed from the oven, allowed to cool to room temperature, (25° C.+/−5° C.), and the laminate was removed from the vacuum bag.

Example 2

The embossed sheet structures noted below in Table 2 were prepared as described above for Example 1.

TABLE 2

Trilayer Sheet Structures.

| Example | Outer Layers (1 mil (0.026 mm) thick) | Inner Layer (18 mils (0.4 mm) thick) |
|---------|---------------------------------------|--------------------------------------|
| AA | Ionomer 3 | Ionomer 1 |
| AB | Ionomer 4 | Ionomer 1 |
| AC | Ionomer 5 | Ionomer 1 |
| AD | Ionomer 3 | EBA 1 |
| AE | Ionomer 4 | EBA 1 |
| AF | Ionomer 5 | EBA 1 |
| AG | Ionomer 1 | Ionomer 6 |
| AH | Ionomer 1 | Blend 5 |
| AI | Ionomer 1 | EBA 1 |
| AJ | Ionomer 1 | EMA 1 |

EBA 1 was a poly(ethylene-co-n-butyl acrylate) with 27 weight percent n-butyl acrylate and a MI of 4 g/10 minutes, (190 C., ISO 1133, ASTM D1238).
Ionomer 6 was a poly(ethylene-co-iso-butyl acrylate-co-methacrylic acid) with 10 weight percent iso-butyl acrylate and 10 weight percent methacrylic acid and neutralized with 16 percent zinc ion with a MI of 10 g/10 minutes, (190 C., ISO 1133, ASTM D1238).
Blend 5 contains 50 weight percent of Ionomer 1 and 50 weight percent of Ionomer 6.
EMA 1 was a poly(ethylene-co-methyl acrylate with 30 weight percent methyl acrylate.

A variety of laminate structures (4 inch by 4 inch) were produced from each embossed sheet described above to demonstrate various solar cell structures as described above for Example 1. The laminate structures included glass/Example/glass, fluoropolymer film/Example/glass, aluminum sheet/Example/glass, aluminum sheet/Example and glass/Example.

Example 3

The embossed sheet structures noted below in Table 3 were prepared as described above for Example 1.

TABLE 3

Trilayer Sheet Structures.

| Example | Outer Layers (5 mil (0.13 mm) thick) | Inner Layer (10 mils (0.25 mm) thick) |
|---------|--------------------------------------|---------------------------------------|
| BA | Ionomer 3 | Ionomer 1 |
| BB | Ionomer 4 | Ionomer 1 |
| BC | Ionomer 5 | Ionomer 1 |

A variety of laminate structures (4 inch by 4 inch) were produced from each embossed sheet described above to demonstrate various solar cell structures as described above for Example 1. The laminate structures included glass/Example/glass, fluoropolymer film/Example/glass, aluminum sheet/Example/glass, aluminum sheet/Example and glass/Example.

Example 4

20 mil (0.51 mm) thick embossed sheets produced similarly to Example 1, above, were produced with the compositions described below in Table 4. Tinuvin® 328, Irganox® 1010, Tinuvin® 770, Tinuvin® 622LD, Chimassorb® 944, Irganox® B215, and Irgafos® 168 are commercial products of the Ciba Corporation. Cyasorb® UV 1164 is a commercial product of the American Cyanamid Corporation.

TABLE 4

Sheet Compositions.

| Example | Compositions (weight percent) |
|---------|-------------------------------|
| CA | 99.92 Ionomer 1 |
|    | 0.08 Tinuvin ® 328 |
| CB | 98.80 Ionomer 1 |
|    | 0.10 Irganox ® 1010 |
|    | 0.50 Cyasorb ® UV 1164 |
|    | 0.30 Tinuvin ® 770 |
|    | 0.30 Tinuvin ® 622LD |
| CC | 98.90 Ionomer 1 |
|    | 0.60 Chimassorb 944 |
|    | 0.30 Tinuvin ® 328 |
|    | 0.20 Irganox ® B215 |
| CD | 99.42 Ionomer 1 |
|    | 0.30 Tinuvin ® 328 |
|    | 0.03 Irgafos ® 168 |
|    | 0.25 Tinuvin ® 622LD |

A variety of laminate structures (4 inch by 4 inch) were produced from each embossed sheet described above to demonstrate various solar cell structures as described above for Example 1. The laminate structures included glass/Example/glass, fluoropolymer film/Example/glass, aluminum sheet/Example/glass, aluminum sheet/Example and glass/Example.

Example 5

An embossed trilayer sheet consisting of 2 mil thick (0.05 mm) outer layers of Ionomer 1 and a 16 mil thick (0.41 mm) thick inner layer of EBA 1 was produced similarly to Example 1.

A variety of laminate structures (4 inch by 4 inch) were produced from each embossed sheet described above to demonstrate various solar cell structures as described above for Example 1. The laminate structures included glass/Example/glass, fluoropolymer film/Example/glass, aluminum sheet/Example/glass, aluminum sheet/Example and glass/Example.

Example 6

An embossed trilayer sheet consisting of 4 mil thick (0.10 mm) outer layers of Ionomer 1 and a 12 mil thick (0.30 mm) thick inner layer of EBA 1 was produced similarly to Example 1.

A variety of laminate structures (4 inch by 4 inch) were produced from each embossed sheet described above to demonstrate various solar cell structures as described above for Example 1. The laminate structures included glass/Example/glass, fluoropolymer film/Example/glass, aluminum sheet/Example/glass, aluminum sheet/Example and glass/Example.

Examples 7

The 12-inch by 12-inch solar cell laminate structures described below in Table 5 are assembled and laminated similarly to described for Example 1, above. Layers 1 and 2 constitute the incident layer of the solar cell laminate and Layers 4 and 5 constitute the back layer of the solar cell laminate.

TABLE 5

Solar Cell Laminate Structures.

| Ex. | Layer 1 | Layer 2 | Layer 3 | Layer 4 | Layer 5 |
|---|---|---|---|---|---|
| 1 | Glass 1 | Example A | Solar Cell 1 | Example A | Glass 1 |
| 2 | Glass 1 | Example B | Solar Cell 4 | Example B | ALF |
| 3 | FPF | Example C | Solar Cell 2 | Example C | ALF |
| 4 | FPF | Example D | Solar Cell 3 | Example D | ALF |
| 5 | FPF | Example E | Solar Cell 4 | Example E | ALF |
| 6 | Glass 1 | Example F | Solar Cell 1 | Example F | Glass 3 |
| 7 | Glass 1 | Example G | Solar Cell 4 | Example G | Glass 2 |
| 8 | Glass 1 | Example H | Solar Cell 1 | Example H | Glass 2 |
| 9 | Glass 2 | Example AA | Solar Cell 4 | Example AA | Glass 2 |
| 10 | FPF | Example AB | Solar Cell 1 | Example AB | Glass 2 |
| 11 | Glass 1 | Example AC | Solar Cell 4 | Example AC | FPF |
| 12 | Glass 1 | Example AD | Solar Cell 1 | Example AD | Glass 1 |
| 13 | Glass 2 | Example AE | Solar Cell 2 | Example AE | Glass 2 |
| 14 | Glass 1 | Example AF | Solar Cell 3 | Example AF | Glass 2 |
| 15 | Glass 1 | Example AG | Solar Cell 4 | Example AG | Glass 2 |
| 16 | Glass 1 | Example AH | Solar Cell 1 | Example AH | ALF |
| 17 | Glass 2 | Example AI | Solar Cell 2 | Example AI | ALF |
| 18 | Glass 2 | Example AJ | Solar Cell 3 | Example AJ | ALF |
| 19 | Glass 1 | Example BA | Solar Cell 4 | Example BA | ALF |
| 20 | FPF | Example BB | Solar Cell 1 | Example BB | ALF |
| 21 | FPF | Example BC | Solar Cell 2 | Example BC | ALF |
| 22 | FPF | Example CA | Solar Cell 3 | Example CA | ALF |
| 23 | FPF | Example CB | Solar Cell 4 | Example CB | ALF |
| 24 | Glass 1 | Example CC | Solar Cell 1 | Example CC | Glass 3 |
| 25 | Glass 1 | Example CD | Solar Cell 4 | Example CD | Glass 2 |
| 26 | Glass 1 | Example CE | Solar Cell 1 | Example CE | Glass 2 |
| 27 | Glass 2 | Example CF | Solar Cell 4 | Example CF | Glass 2 |

FPF is a corona surface treated Tedlar ® film grade WH15BL3 (1.5 mil thick (0.038 mm)), a product of the DuPont Corporation.
Glass 1 is Starphire ® glass (3.2 mm thick) from the PPG Corporation.
Glass 2 is a clear annealed float glass plate layer, (2.5 mm thick).
Glass 3 is a Solex ® solar control glass, (3.0 mm thick).
ALF is an aluminum sheet (3.2 mm thick) and is 5052 alloyed with 2.5 weight percent magnesium and conforms to Federal specification QQ-A-250/8 and ASTM B209.
Solar Cell 1 is a 10-inch by 10-inch amorphous silicon photovoltaic device comprising a stainless steel substrate (125 micrometers thick) with an amorphous silicon semiconductor layer, (U.S. Pat. No. 6,093,581, Example 1).
Solar Cell 2 is a 10-inch by 10-inch copper indium diselenide (CIS) photovoltaic device, (U.S. Pat. No. 6,353,042, column 6, line 19).
Solar Cell 3 is a 10-inch by 10-inch cadmium telluride (CdTe) photovoltaic device, (U.S. Pat. No. 6,353,042, column 6, line 49).
Solar Cell 4 is a silicon solar cell made from a 10-inch by 10-inch polycrystalline EFG-grown wafer (U.S. Pat. No. 6,660,930, column 7, line 61).

Example 8

Various textured ionomer sheets (Ionomer 3) were prepared via roll embossing for study of trapped air during the laminating process. A variety of laminate structures were created (glass/Example/glass) to simulate encapsulation of the interlayer sheets by rigid outer plies. Glass facilitated the visual examination of residual trapped air and bubble formation. Annealed glass (3 mm in thickness by 300 mm square) was washed with detergent (trisodium phosphate @ 3 gms./liter) and rinsed thoroughly with demineralized water and allowed to air dry. Prelaminate assemblies were created by sandwiching the respective interlayers between two pieces of said glass and taping in a couple locations to secure the relative positions of the layers to one another. The presmoothed ionomer interlayer was created by placing abrasion-resistant polycarbonate sheeting (Lexan®/6 mm thickness) on both sides of the ionomer, vacuum bagging and heating to 120° C. for 30 minutes. Following cooldown to room temperature the polycarbonate sheeting was removed yielding a very smooth and flat surface on the ionomer.

The prelaminate structures were then heated to various temperatures (60, 75, 90, 100, 110 or 125° C.) to represent different conditions/variations within a typical roll-press laminating process. A wider temperature range (processing window) for roll pre-pressing yields a more robust process for producing high quality (bubble-free) laminates. The roll prepress process must remove a substantial amount of air from between the various layers within the laminate surface and provide some adhesion ('tacking') to develop between the various layers. In fact, the tack level at the edge must reach a level whereby minimal air penetration back into the laminate structure can occur during the autoclave step (where high-pressure air (gas) is present). This results in the formation of bubbles or failure of the laminate structure to form a physical bond. Another factor to consider for final aesthetic and quality consideration is the tendency for the appearance of trapped contamination to become visual in the finished article. As the surface pattern frequency goes higher (pattern smaller) the visual appearance of trapped contamination is minimized as compared with the bold 2-mil diamond pattern. This should render any interfacial haze unobservable at least as discrete patterned areas. Interfacial haze was an ionomer sheet/glass interfacial 'contamination' that appeared in patchy areas but was significant enough to occasionally be commercially unacceptable.

It is important not to have too much residual air or other volatiles/gaseous components which can be manifested as bubbles after the lamination step is complete or occurring later as a latent bubble. To further assess the quality of the laminate with regard to the amount of residual air that was trapped within the laminate during the prepressing step and subsequent autoclave step, a bake test was conducted. A ready measure of this bubble tendency as a quality indicator can be correlated against results from a bake test. This test consists of a progressive heating of the laminates in stages and observing where and how many (and size) bubbles appear and at what temperature. In this testing, laminate structures were heated to 105° C. held for 2 hours, followed by inspection for the formation of air bubbles, then the sample was progressively heated to 120° C., 135° C. and finally 150° C., repeating the inspection process after each heating and 2 hour hold time. All laminates exhibited edge bubbles which is not unusual and is generally ignored by the standard practices used in the laminating industry. Table 6 provides results of the laminating process temperature range over a range of interlayer material types and surface textures.

TABLE 6

Roll Prepress Temperature Range (° C.) for Optimal Quality (Low Bubble Count in Bake Test)

| Interlayer Type Ionomer 3 Laminate Structure (2 lites of 3 mm glass) | Surface Pattern Roughness Measurements | | Roll Prepress linear speed | | | |
|---|---|---|---|---|---|---|
| | Roughness $R_t$ | Area Kurtois | 2.0 meters/min. | | 3.5 meters/min. | |
| | (top/bottom) | (top/bottom) | low | high | low | high |
| Comparative Sample A - Ionomer 'smooth' | 2.4/1.8 | N/a | 60 | 75 | 60 | 75 |
| Sample A - Ionomer 2 mil 'Diamond' | 61.8/22.6 | 1.92/3.39 | 100 | 110 | 100 | 110 |
| Sample B - 'Waffle iron' pattern at 30 degree angle | 20.0/10.1 | 3.84/1.44 | 75 | 110 | 75 | 110 |
| Sample C - 'Waffle iron' pattern at 30 degree angle | 17.9/8.1 | 3.34/1.48 | 75 | 110 | 75 | 110 |
| Comparative Sample B - | 14.9/6.9 | 8.94/4.21 | 75 | 90 | 70 | 90 |

TABLE 6-continued

Roll Prepress Temperature Range (° C.) for Optimal Quality
(Low Bubble Count in Bake Test)

| Interlayer Type Ionomer 3 Laminate | Surface Pattern Roughness Measurements | | Roll Prepress linear speed | |
|---|---|---|---|---|
| Structure (2 lites of 3 mm glass) | Roughness $R_t$ (top/bottom) | Area Kurtois (top/bottom) | 2.0 meters/min. low  high | 3.5 meters/min. low  high |
| Ionomer 'random' | | | | |

FIG. 1 is a micrograph showing a pattern similar to the pattern of Samples B and C.

The processing temperature range (process 'window') was found to be quite narrow (15° C.) for both Comparative Samples A and B as compared with Samples B and C where the process window is expanded to 35° C. (@2.0 m/min. linear speed). The higher roughness of Sample A requires a much higher roll pre-press temperature to collapse the surface texture and the process window was found in this case to be narrow. This is due to the rapid softening of the ionomer material as the processing temperature approached and exceeded the melting point for ionomer 3 (~96° C. by DSC). The tack level between the glass and ionomer for Comparative Sample A was found to be fragile, sometimes resulting in portions of the laminate structure reopening during handling due to flexure and stress. This was due to the low temperatures experienced during roll pre-presssing. Comparative Sample B had adequate tack level but the process window was still too narrow for obtaining high yields at acceptable quality as compared with the examples of this invention. Little change in the process window temperatures was noted between the two different roll pre-press speeds tested (2 and 3.5 m/min.) which provides greater processing rates/throughput during manufacturing.

The invention claimed is:

1. A photovoltaic prelaminate assembly comprising solar cell(s) and a layer of a monolayer thermoplastic film or sheet having a thickness of about 1 mil to about 25 mils consisting essentially of a copolymer of alpha olefin(s) with alpha, beta ethylenically unsaturated carboxylic acid comonomer(s), ionomers derived therefrom and combinations thereof, wherein the surface is embossed with a pattern which provides channels for de-airing, the channels having an average depth of about 12 microns to about 20 microns and a width of about 30 microns to about 300 microns, and which are spaced about 0.1 mm to about 1 mm apart.

2. The photovoltaic prelaminate assembly of claim 1 wherein the copolymer is an ethylene (meth)acrylic acid copolymer containing about 10 to about 22 weight percent repeat units from (meth)acrylic acid, based on the total weight of the copolymer.

3. The photovoltaic prelaminate assembly of claim 1 wherein the film or sheet is embossed with the pattern on only one side.

4. The photovoltaic prelaminate assembly of claim 1 wherein the film or sheet is embossed with the pattern on both sides.

5. The photovoltaic prelaminate assembly of claim 1 wherein the surface that is embossed has a surface pattern characterized by $AR_t$ less than 32 µm, a ratio of ARp to $AR_t$, of between 0.42 and 0.62, and an area kurtosis of less than about 5.

6. The photovoltaic prelaminate assembly process of claim 5 wherein the ratio of ARp to $AR_t$, is 0.52 to 0.62.

7. The photovoltaic prelaminate assembly of claim 5 wherein the pattern is a regular pattern which provides relatively uninterrupted channels for de-airing in two or three directions and wherein the surface that is embossed has a surface pattern characterized by $AR_t$ less than 32 µm, a ratio of ARp to $AR_t$, between 0.42 and 0.62, and an area kurtosis of less than about 5.

8. The photovoltaic prelaminate assembly of claim 7 wherein the pattern comprises protrusions of copolymer surrounded by channels.

9. The photovoltaic prelaminate assembly of claim 5 wherein the pattern comprises channels running in more than one direction through the film or sheet.

10. The photovoltaic prelaminate of claim 5 wherein the pattern comprises channels running in two directions.

11. The photovoltaic prelaminate assembly of claim 5 wherein the pattern comprises channels running in two directions perpendicular to each other.

12. The photovoltaic prelaminate assembly of claim 5 wherein the pattern comprises channels running in three directions.

13. The photovoltaic prelaminate assembly of claim 1 wherein the channels have an average depth of 12 to 20 microns.

14. The photovoltaic prelaminate assembly of claim 1 wherein the thermoplastic film or sheet has a thickness of about 1 mil to about 20 mils.

15. A photovoltaic prelaminate assembly comprising (a) solar cell(s) and (b) a layer comprising a multilayer thermoplastic film or sheet (i) having a thickness of about 1 mil to about 25 mils, (ii) containing at least one outer layer (A) of a copolymer of alpha olefin(s) with alpha, beta ethylenically unsaturated carboxylic acid comonomer(s), ionomers derived therefrom and combinations thereof, (B) with an outer surface that is embossed with a pattern which provides channels for de-airing, the channels having an average depth of about 12 microns to about 20 microns and a width of about 30 microns to about 300 microns, and which are spaced about 0.1 mm to about 1 mm apart.

16. The photovoltaic prelaminate assembly of claim 15 wherein the multilayer thermoplastic film or sheet is embossed through one or more layers.

17. The photovoltaic prelaminate assembly of claim 15 wherein the multilayer thermoplastic film or sheet contains two layers, one layer being the surface embossed layer and the second layer comprising a polymer selected from the group consisting of ethylene vinyl acetate, ionomer, or ethylene acrylate ester copolymers.

18. The photovoltaic prelaminate assembly of claim 15 wherein the multilayer thermoplastic film or sheet contains at least three layers, wherein one outside surface of the at least three layers comprises the surface embossed layer and the other outside surface of the at least three layers comprises a second surface embossed layer comprising a copolymer of alpha olefin(s) with alpha, beta ethylenically unsaturated carboxylic acid comonomer(s), ionomers derived therefrom and combinations thereof useful for making solar cell laminates, wherein the second surface is embossed with a pattern which provides channels for de-airing, the channels having an average depth of about 12 microns to about 20 microns and a width of about 30 microns to about 300 microns and which are spaced about 0.1 mm to about 1 mm apart.

19. The photovoltaic prelaminate assembly of claim 18 wherein the multilayer film or sheet contains three layers with two outer layers and an inner layer, and the inner layer comprises a polymer selected from the group consisting of ethylene vinyl acetate, ionomer, or ethylene acrylate ester copolymers.

20. The photovoltaic prelaminate assembly of claim 8 wherein the surface that is embossed has a surface pattern characterized by $AR_t$ less than 32 μm, a ratio of ARp to $AR_t$, of between 0.42 and 0.62, and an area kurtosis of less than about 5.

21. The photovoltaic prelaminate assembly of claim 20 wherein the ratio of ARp to $AR_t$, is 0.52 to 0.62.

22. A photovoltaic prelaminate assembly comprising an incident layer; a monolayer thermoplastic film or sheet having a thickness of about 1 mil to about 25 mils consisting essentially of a copolymer of alpha olefin(s) with alpha, beta ethylenically unsaturated carboxylic acid comonomer(s), ionomers derived therefrom and combinations thereof, wherein the surface is embossed with a pattern which provides channels for de-airing, the channels having an average depth of about 12 microns to about 20 microns and a width of about 30 microns to about 300 microns, and which are spaced about 0.1 mm to about 1 mm apart, wherein the surface that is embossed has a surface pattern characterized by $AR_t$ less than 32 μm, a ratio of ARp to $AR_t$, of 0.52 to 0.62, and an area kurtosis of less than about 5; solar cell(s); an additional layer comprising either a second layer of the thermoplastic film or sheet or another encapsulant layer; and a back sheet.

23. A process of manufacturing a solar cell article with embedded solar cell(s) comprising the steps of (1) preparing a prelaminate assembly comprising an incident layer, a monolayer thermoplastic film or sheet, the solar cell(s), an additional layer comprising either a second layer of the monolayer thermoplastic film or sheet or another encapsulant layer, and a back sheet, wherein the thermoplastic film or sheet has a thickness of about 1 mil to about 25 mils and contains a surface embossed layer comprising a copolymer of alpha olefin(s) with alpha, beta ethylenically unsaturated carboxylic acid comonomer(s), ionomers derived therefrom and combinations thereof, wherein the surface is embossed with a pattern which provides channels for de-airing, the channels having an average depth of about 12 to about 20 microns about 12 and a width of about 30 microns to about 300 microns, wherein the surface that is embossed has a surface pattern characterized by $AR_t$ less than 32 μm, a ratio of ARp to $AR_t$, of 0.52 to 0.62, and an area kurtosis of less than about 5; and (2) laminating the prelaminate assembly to form the solar cell article.

24. A process of manufacturing a solar cell article with embedded solar cell(s) comprising the steps of (1) preparing a prelaminate assembly comprising an incident layer, a monolayer thermoplastic film or sheet, the solar cell(s), an additional layer comprising either a second layer of the monolayer thermoplastic film or sheet or another encapsulant layer, and a back sheet, wherein the thermoplastic film or sheet has a thickness of about 1 mil to about 25 mils and contains a surface embossed layer comprising a copolymer of alpha olefin(s) with alpha, beta ethylenically unsaturated carboxylic acid comonomer(s), ionomers derived therefrom and combinations thereof, wherein the surface is embossed with a pattern which provides channels for de-airing, the channels having an average depth of about 12 microns about 20 microns, a width of about 30 microns to about 300 microns and spaced about 0.1 mm to about 1 mm apart; and (2) laminating the prelaminate assembly to form the solar cell article.

25. The process of claim 24 wherein the channels have an average depth of 12 microns to 20 microns, and wherein the copolymer is an ethylene (meth)acrylic acid copolymer containing about 10 to about 22 weight percent repeat units from (meth)acrylic acid, based on the total weight of the copolymer.

26. The process of claim 25 wherein the film or sheet is embossed with the pattern on both sides.

27. The process of claim 25 wherein the pattern comprises protrusions of copolymer surrounded by channels.

28. The process of claim 25 wherein the pattern comprises channels running in two directions through the film or sheet.

* * * * *